United States Patent [19]

Sunada

[11] Patent Number: 5,382,754
[45] Date of Patent: Jan. 17, 1995

[54] ELECTRONIC PART OF SURFACE MOUNTED TYPE AND ITS MOUNTING METHOD

[75] Inventor: Shigemasa Sunada, Kyoto, Japan

[73] Assignee: Rohm Co., Ltd., Kyoto, Japan

[21] Appl. No.: 34,371

[22] Filed: Mar. 18, 1993

[30] Foreign Application Priority Data

Mar. 19, 1992 [JP] Japan .................................. 4-063240

[51] Int. Cl.⁶ .............................................. H05K 5/06
[52] U.S. Cl. ...................................... 174/52.3; 361/807
[58] Field of Search ................... 174/52.3, 52.1, 52.4; 361/806, 807, 808, 809, 760; 257/678, 730, 731

[56] References Cited

U.S. PATENT DOCUMENTS

| | | | |
|---|---|---|---|
| 4,339,785 | 7/1982 | Ohsawa | 361/400 |
| 4,654,290 | 3/1987 | Spanjer | 430/138 |
| 4,752,668 | 6/1988 | Rosenfield | 219/121 LH |
| 5,248,990 | 9/1993 | Ishiyawa et al. | 346/1.1 |
| 5,313,365 | 5/1994 | Pennisi et al. | 361/760 |

*Primary Examiner*—Leo P. Picard
*Assistant Examiner*—Christopher Horgan
*Attorney, Agent, or Firm*—Nikaido, Marmelstein, Murray & Oram

[57] ABSTRACT

A central region of the bottom surface of a resin in which a diode chip and a base end portion of each of two lead terminals electrically connected to the chip is burning-treated by irradiating a laser beam in order to remove fat and oil existing in the bottom surface. Thereby, the deterioration of adhesive strength of an adhesive agent for fixing the bottom surface of the resin to a circuit board is prevented.

1 Claim, 5 Drawing Sheets

ELECTRONIC PART OF SURFACE MOUNTED TYPE AND ITS MOUNTING METHOD

BACKGROUND OF THE INVENTION

1. Field of the Invention

The present invention relates to an electronic part of surface mounted type which is constituted by a chip, such as a diode device and a transistor device, molded in resin and a method of fixing such an electronic part onto a circuit board.

2. Description of the Prior Art

FIG. 1 shows a conventional structure of a two-terminal diode part exemplifying an electronic part of surface mounted type. As shown in FIG. 1, in a conventional diode part 10, a chip 12 of a diode device is fixed onto a mount portion 11a, and the chip 12 and two lead terminals 11b which are external lead portions are electrically connected by, for example, bonding wires 13. Under this condition, the mount portion 11a, the chip 12, and a base end portion of each of the lead terminals 11b are molded in a resin 14. A portion of each of the lead terminals 11b which is protruding out of the resin 14 is bent downward. Since the molding of the resin 14 is performed by use of a metal mold, the resin 14 is formed into a rectangular parallelepiped block form having a flat bottom surface.

As a method of mounting the part 10 thus molded in resin onto a circuit board, a so-called wave soldering method is widely used in which a portion required to be connected is dipped in a liquid wave solder. FIGS. 2A to 2D sequentially show an example of a process of fixing the diode part 10 of the above-described conventional structure onto a circuit board by the wave soldering method.

First, as shown in FIG. 2A, an adhesive agent 16 is applied onto a predetermined fixing position on a circuit board 15. Then, as shown in FIG. 2B, the bottom surface of the resin 14 is placed onto the adhesive agent 16, and by hardening the adhesive agent 16 under this condition, the diode part 10 is auxiliarily fixed onto the circuit board 15. Under this condition, the lead terminals 11b are normally in contact with a circuit pattern (not shown) formed on the circuit board 15.

After the pretreatment has been completed in which the application and hardening of the adhesive agent are performed, by dipping the diode part 10 into wave solder in a solder bath 17 under a condition where the circuit board 15 is being turned upside down as shown in FIG. 2C, the diode pattern 10 is fixed under a condition where the lead terminals 11b are electrically connected onto the circuit pattern on the circuit board 15 as shown in FIG. 2D.

In fixing the diode part 10 onto the circuit board 15 by the above-described wave soldering method, if the resin 14 and the adhesive agent 16 are not completely fixed in the auxiliary fixing in the pretreatment shown in FIGS. 2A and 2B, the diode part 10 may be fall off from the circuit board 15 when the circuit board 15 is turned upside down in the dipping treatment into the solder bath 17 shown in FIG. 2C.

Such a falling off of the diode part 10 from the circuit board 15 due to incomplete fixing results from a fact that fat and oil included in the resin 14 constituting the fixing surface of the diode part 10 deteriorates the adhesive strength of the adhesive agent 16.

Conventionally, the incomplete fixing has been prevented by taking the following measures:

(i) fat and oil included in the surface of the resin is removed by a so-called burning method in which the surface of the resin is burned by putting the surface into flames prior to the fixing;

(ii) an adhesive agent is used whose adhesive strength is not deteriorated by fat and oil; and (iii) fat and oil is also removed when refuse of the resin produced in the resin molding is removed by use of a sandblaster.

In a case where the burning method mentioned in (i) is used, however, it is necessary to install equipment for the burning treatment and peripheral equipment such as an exhauster for exhausting smoke generated in the burning treatment, which results in an increase of the cost of equipment. Moreover, in the burning method, since flames are used, the degree of safety is low, and there is danger in operating a flame generator. Further, in a case where a limited region of a narrow surface such as the bottom surface of the diode part 10 is burning-treated, it is difficult to perform control such as specification of a treatment region, and in addition, if the flames are not appropriately controlled, there are cases where incomplete fixing and short circuit occur. Hence, in actuality, it is extremely difficult to use the burning method.

The adhesive agent mentioned in (ii) whose adhesive strength is not deteriorated by fat and oil is desirable in that the falling off of the part can be prevented. However, since such an adhesive agent is extremely expensive compared to normally-used adhesive agents, the use thereof will largely increase the cost of the electric part. From this, it can be regarded as an impractical method.

The sandblaster mentioned in (iii) is originally used for removing refuse of resin. It is therefore difficult to specify the treatment region on the bottom surface of the resin and to control the degree of treatment. Hence, it is not suitable for processing which requires accuracy such as the surface treatment of electronic parts of this type.

SUMMARY OF THE INVENTION

An object of the present invention is to provide an electronic part and its mounting method where auxiliary fixing by use of adhesive agent in mounting the electronic part onto a circuit board can easily and surely be made in a low-cost manner.

To achieve the above-mentioned object, an electronic part of the present invention is provided with: a chip which is an electronic part device; a plurality of lead terminals electrically connected to said chip; and a resin in which said chip and a base end portion of each of said lead terminals are molded, wherein for mounting said electronic part onto a circuit board, at least a part of a predetermined surface of said resin which is a fixing surface to which an adhesive agent is applied is burning-treated by irradiating a laser beam.

With such a feature, since a substance such as fat and oil which can deteriorates the adhesive strength of the adhesive agent in the auxiliary fixing of the electronic part can be removed from the fixing surface, the deterioration of adhesive strength of the adhesive agent can be prevented. As a result, since the auxiliary fixing of the electronic part can surely be made, a problem of the falling of the electronic part into a solder bath due to incomplete fixing can be eliminated to improve the productivity of an electric part.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
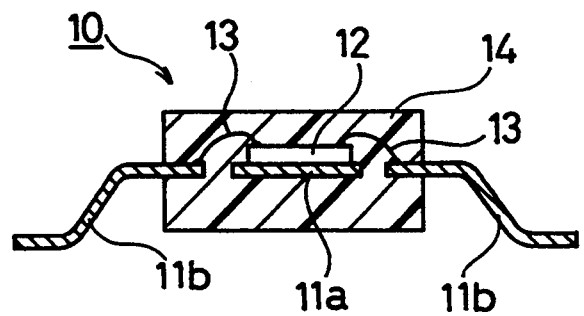
FIG. 1 is a longitudinal sectional view schematically showing a condition where a conventional electronic part is mounted on a circuit board.
Figure 2A:
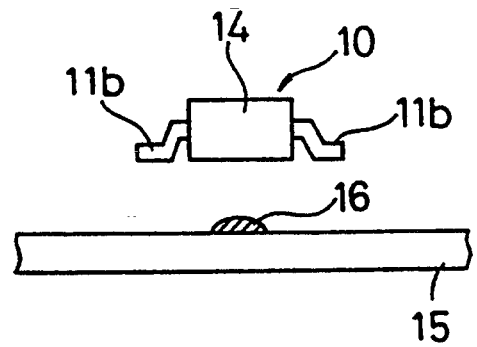
FIGS. 2A to 2D are schematic views sequentially showing a mounting process of the conventional electronic part.
Figure 2B:
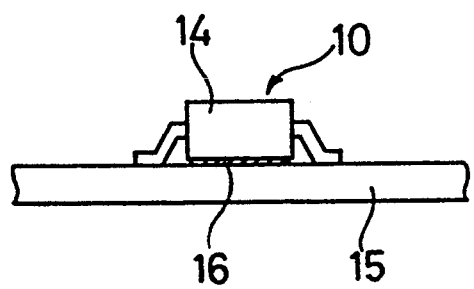
Figure 2C:
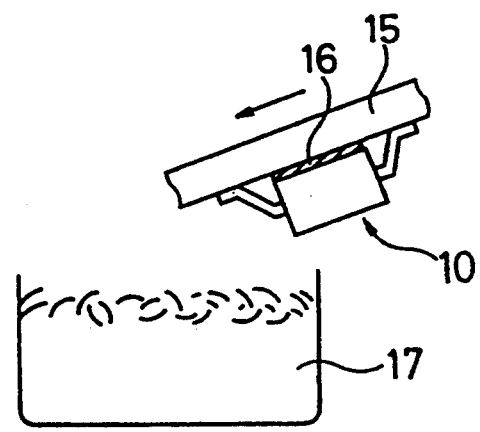
Figure 2D:
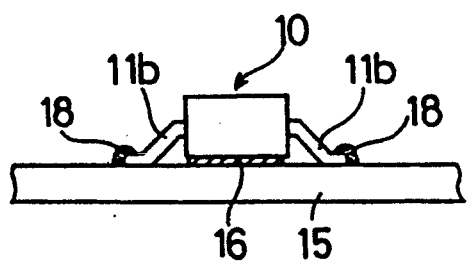
Figure 3:
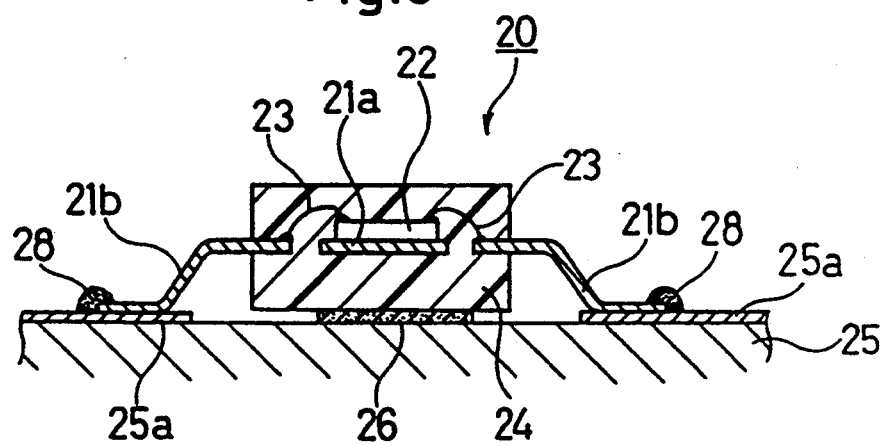
FIG. 3 is a longitudinal sectional view schematically showing a condition where an electronic part which is an embodiment of the present invention is mounted on a circuit board.

FIG. 3 shows a condition where a diode part embodying the present invention is mounted on a circuit board. In FIG. 3, 20 represents a diode part embodying the present invention. The diode part 20 has a mount portion 21a in its center. A chip 22 is attached onto the upper surface of the mount portion 21a.

At both sides of the mount portion 21a, two lead terminals 21b which are external lead portions are provided while they are electrically insulated from the mount portion 21a. A base end portion of each of the lead terminals 21b is electrically connected to the chip 22 by, for example, a bonding wire 23. Under this condition, a central portion of the diode part 20 including the chip 22, the mount portion 21a and the base end portions of the lead terminals is molded in a resin 24.

The other end portions of the lead terminals 21b which protrude out of the resin 24 are bent to be on the same surface as the bottom surface of the resin 24 or lower than the bottom surface so that the end portions are in contact with a circuit board 25. Since the molding of the resin 24 is performed by use of a metal mold, the resin 14 is formed into a rectangular parallelepiped block form having a flat bottom surface.

Figure 9A:
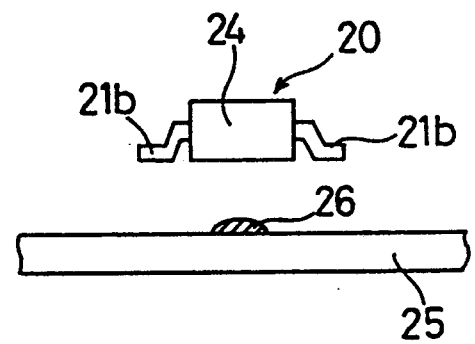
FIGS. 9A to 9D are schematic views sequentially showing a mounting process of a two-terminal electric part in the embodiment of FIG. 3 of the present invention.
Figure 9B:
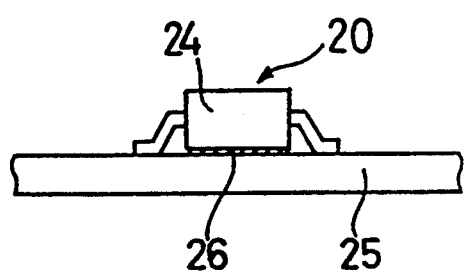
Figure 9C:
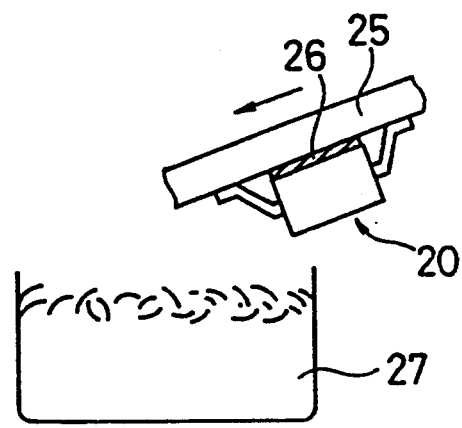
Figure 9D:
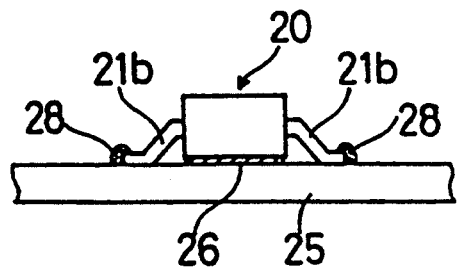

FIGS. 9A to 9D sequentially show an example of a process of mounting the diode part 20 of the above-mentioned structure onto the circuit board 25. That is, through the previously-described known process, the diode part 20 is auxiliarily fixed onto the circuit board 25 by placing the bottom surface of the resin 24 which is a fixing surface onto an adhesive agent 26 applied onto a predetermined fixing position on the surface of the circuit board 25 as shown in FIG. 9A and hardening the adhesive agent 26 under this condition as shown in FIG. 9B. Thereafter, a soldering treatment is made by the wave soldering method under a condition where the circuit board is being turned upside down as shown in FIG. 9C. The numeral 27 represents a solder bath. Through this process, the diode part 20 is finally fixed under a condition where the lead terminals 21b are electrically connected to a circuit pattern 25a on the circuit board 25 through a solder 28.

Figure 4:
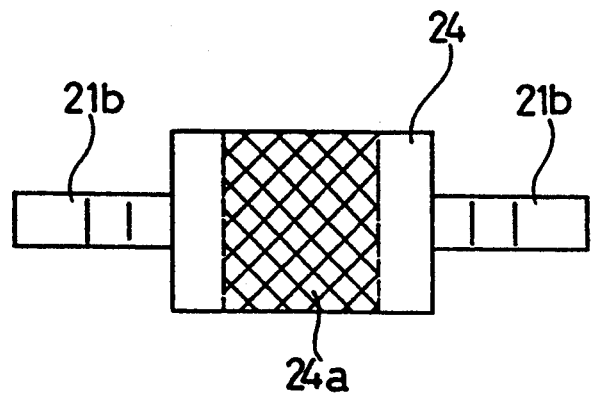
FIG. 4 is a view showing a bottom surface of the electronic part of FIG. 3.

In this embodiment, in the diode part 20 fixed onto the circuit board 25 in the above-described manner, as shown in FIG. 4, a central region 24a on the flat bottom surface of the resin 24 which is a fixing surface to the circuit board 25, that is, a region shown by intersecting oblique lines in FIG. 4 is burning-treated by laser beam irradiation. The burning treatment is performed prior to the auxiliary fixing in which the diode part 20 is auxiliarily fixed onto the adhesive agent 26 applied to the circuit board 25. By the burning treatment, fat and oil of the bottom surface of the resin 24 is effectively removed. As a result, in the auxiliary fixing, the deterioration of adhesive strength of the adhesive agent to the bottom surface of the resin 24 can surely be prevented.

Specifically, in the burning treatment, the predetermined central region 24a on the bottom surface of the resin 24 is burned by laser beam irradiation. Since the degree of the burning treatment is similar to the degree of a marking treatment conventionally performed for the upper surface of the resin 24 by use of a laser apparatus, the characteristics of the chip 22 molded in resin 24 are not affected by the burning treatment.

That is, the laser apparatus used for marking the upper surface of the diode part 20 with a product number can also be used for the burning treatment in this embodiment. In that case, by controlling beam intensity and oscillation wave length in the laser apparatus (not shown) so as to be in an appropriate condition and scanning the central region 24a on the bottom surface of the resin 24 by use of a laser beam, fat and oil existing in the region 24a can nearly completely be removed. As the laser for the surface treatment, any kinds of lasers, e.g. a carbon dioxide gas laser and a YAG laser, can be used.

Figure 5:
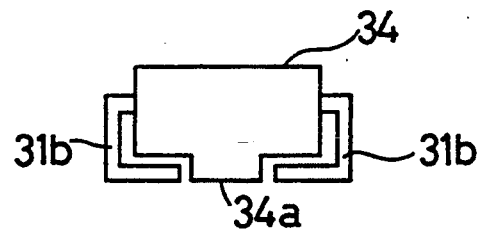
FIG. 5 is a front view schematically showing an electronic part which is another embodiment of the present invention.
Figure 6:
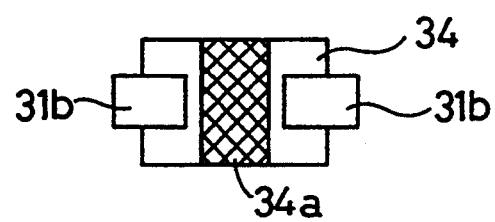
FIG. 6 is a view showing a bottom surface of the electronic part of FIG. 5.

FIGS. 5 and 6 show another embodiment of the present invention. An electronic part according to this embodiment is a two-terminal part of J-bent type, and the package configuration of a resin 34 is different from that of the above-described embodiment. Specifically, a central region 34a on the bottom surface of the resin 34 protrudes from the bottom surface and is flat.

In this embodiment, as shown in FIG. 6, since the central portion 34a which protrudes most downward corresponds to the fixing surface to the circuit board 25, the entire surface of the region 34a is burning-treated. In FIG. 6, a portion shown by intersecting oblique lines is the region which is burning-treated by means of laser beam irradiation. Reference designations 31b represent lead terminals.

Figure 7:
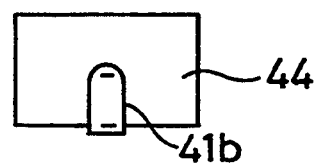
FIG. 7 is a front view schematically showing an electronic part which is still another embodiment of the present invention.
Figure 8:
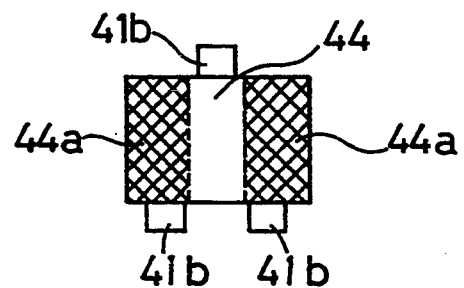
FIG. 8 is a view showing a bottom surface of the electronic part of FIG. 7.

FIGS. 7 and 8 show still another embodiment of the present invention. An electronic part according to this embodiment is common to the first-described embodiment in that the package configuration of a resin 44 is of rectangular parallelepiped form, but is different from the above-described two embodiments in that it is a three-terminal part having three lead terminals 41b altogether at the front and rear sides of the resin 44.

In this embodiment, as shown in FIG. 8, the fixing portion to the circuit board 25 is divided into two portions where the lead terminal 41b at the front center is not provided, that is, two regions 44a on both sides of the bottom surface of the resin 44. Each of the regions 44a is burning-treated by means of a laser beam. In FIG. 8, portions shown by intersecting oblique lines are the regions burning-treated by means of laser beam irradiation.

As described above, in the above-described embodiments, since the control of the specification of the treatment portion and the degree of the treatment required for removing fat and oil is facilitated by using a laser beam, it is possible to provide two surface treatment portions as shown in the embodiment of FIG. 8.

While in the above-described embodiments, electronic parts having a small number of terminals such as a two-terminal part and a three-terminal part are described, the present invention is not limited thereto; the present invention may be employed for multi-terminal parts such as integrated circuits (ICs) as far as they are electronic parts for surface mounting molded in resin.

As described above, according to the present invention, by burning-treating the fixing surface to the circuit board of the electronic part by means of a laser beam, needless to say that fat and oil existing in the fixing surface can easily be removed, the treatment can uniformly be performed. Hence, the adhesive strength of the adhesive agent for the auxiliary fixing is not deteriorated by remaining fat and oil caused by non-uniformity of the treatment, so that the auxiliary fixing of the electronic part can surely be made.

As a result, since no incomplete fixing of the part occurs, the adjustment of a part fixed position required when incomplete fixing occurs is unnecessary, which largely contributes to the improvement in productivity.

If the laser equipment used for the marking of the part is also used for the burning treatment of the surface of the part of the present invention, since it is unnecessary to install more equipment, the increase of cost of products attributed to the increase of the cost of equipment is not brought about.

Since the adhesive strength in fixing the surface of the part to the circuit board remarkably increases by the highly-accurate, uniform burning treatment of the surface of the part, an inexpensive adhesive agent having a less adhesive strength can be used. As a result, the cost of product can be reduced.

As described above, according to the present invention, by the employment of the burning treatment of the fixing surface of the part by means of a laser beam, operations in the treatment process can safely and easily be performed compared to the conventional burning method, and further, the control of the specification of the treatment portion and the degree of treatment can easily and highly-accurately be performed. As a result, the auxiliary fixing using adhesive agent can surely and easily be performed for not only two-terminal and three-terminal parts having a small number of terminals but also multi-terminal parts such as ICs.

Obviously, many modifications and variations of the present invention are possible in light of the above teachings. It is therefore to be understood that within the scope of the appended claims, the invention may be practiced other than as specifically described.

What is claimed is:

1. An electronic part of surface mounted type, comprising:
    a chip which is an electronic part device;
    a plurality of lead terminals electrically connected to said chip; and
    a resin in which said chip and a base end portion of each of said lead terminals are molded, said resin having a fixing surface thereof, said fixing surface having a laser burning-treated surface, wherein said fixing surface provides enhanced adhesive properties,
    wherein for mounting said electronic part onto a circuit board, at least a part of said fixing surface includes an adhesive agent applied thereto.

* * * * *